Jan. 1, 1974 TAKAO SHITAYA ET AL 3,783,051

METHOD OF MAKING LIGHT EMITTING DIODE WITH GOOD BRIGHTNESS CHARACTERISTIC

Filed April 25, 1972

United States Patent Office 3,783,051
Patented Jan. 1, 1974

3,783,051

METHOD OF MAKING LIGHT EMITTING DIODE WITH GOOD BRIGHTNESS CHARACTERISTIC

Takao Shitaya, Nara, Toru Ishida, Katano, Osaka, and Hisanao Sato, Ibaraki, Osaka, Japan, assignors to Matsushita Electric Industrial Co., Ltd., Osaka, Japan Filed Apr. 25, 1972, Ser. No. 247,270
Int. Cl. H01l 7/44
U.S. Cl. 148—189 2 Claims

ABSTRACT OF THE DISCLOSURE

A method of making a light emitting diode having good brightness of emitted light. A wafer of a single crystal of n-type solid solution of CdTe and MgTe including, as a dopant, 0.001 to 0.01 atomic percent of Al is heated in a vapor phase of P and Cd at a temperature of 670° to 850° C., for instance 670° to 790° C., for a time period of 15 minutes to 72 hours, for instance 15 minutes to 10 hours, for diffusing p into said n-type wafer so as to form a thin p-type layer.

This invention relates to a method for making a light emitting diode having a p-n junction formed on a single crystal of a solid solution of cadmium telluride and magnesium telluride.

U.S. Patent No. 3,413,507 has disclosed a light emitting diode comprising a p-n junction consisting of n-type $Cd_{1-x}Mg_xTe$ and p-type $Cd_{1-x}Mg_xTe$, wherein the p-n junction is formed by heating a wafer of n-type $Cd_{1-x}Mg_xTe$ including, as a dopant, 0.01 to 0.5 atomic percent of Al in a vapor phase of P and Cd at 800° to 900° C. for 3 to 15 days.

The $Cd_{1-x}Mg_xTe$ is defined as a solid solution of CdTe and MgTe wherein $x$ indicates the mole fraction of MgTe in the solid solution.

The light emitting diode prepared by the method of U.S. Pat. No. 3,413,507 is not entirely satisfactory as regards the brightness of the light emitted.

An object of the present invention is to provide a method for making a light emitting diode which has a good brightness of the light emitted and which comprises a solid solution of CdTe and MgTe.

Figure 1:
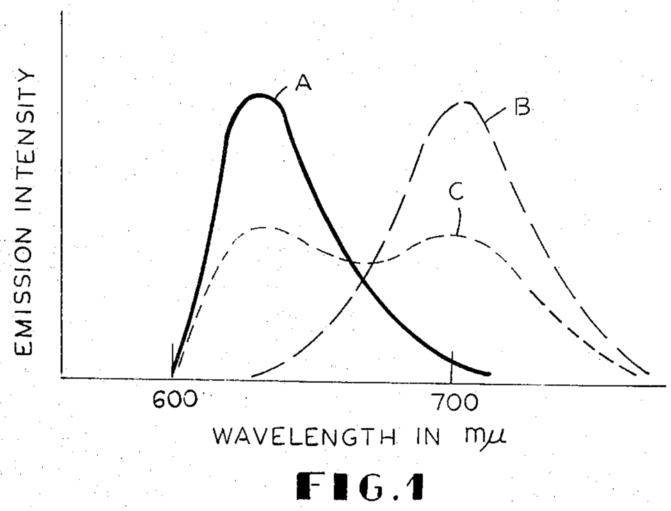
Figure 2:
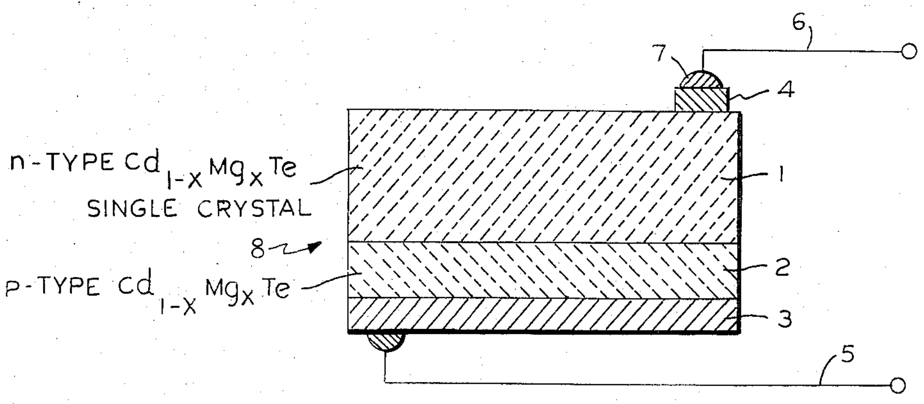

This and other objects of the invention will be apparent upon consideration of the following detailed description taken together with the accompanying drawings wherein:

FIG. 1 is a graph illustrating emission spectra of light emitting diodes which comprise a solid solution of $Cd_{0.6}Mg_{0.4}Te$ and including, as a dopant, either 0.005 atomic percent of Al (curve A), 0.05 atomic percent of Al (curve B), or 0.01 atomic percent of Al (curve C); and FIG. 2 is a cross sectional view of a light emitting diode according to the present invention.

The method for making a light emitting diode according to the present invention comprises providing a wafer of an n-type single crystal of $Cd_{1-x}Mg_xTe$ including, as a dopant, 0.001 to 0.01 atomic percent of Al, and heating said wafer in a vapor phase of P and Cd at 670° to 850° C., for instance 670 to 790° C., for 15 minutes to 72 hours, for instance 15 minutes to 10 hours, to form a thin layer of p-type $Cd_{1-x}Mg_xTe$ on the surface of the wafer.

Heating at a higher temperature for a longer time period results in a poorer brightness which may be attributable to the formation of lattice defects in the resultant wafer.

It has been discovered according to the invention that the brightness of the resultant diode is good when the Al concentration is less than 0.01 atomic percent. The Al concentration has a significant effect on the light emission spectrum of the resultant diode. This will be readily understood by comparing curves (A), (B), and (C) of FIG. 1 with each other. Al dopant in an amount less than 0.001 atomic percent produces a wafer having an electric resistivity higher than about 100 ohm-cm. and is not suitable for a resultant light emitting diode. The brightness of the diode corresponding to the curve (A) is much better than that corresponding to the curve (B) because of the dependence of the sensibility of the human eye to brightness on the wavelength of the light.

A solid solution of any mole fraction $x$ of MgTe can have the brightness thereof improved by using the novel method according to the present invention. A preferred mole fraction X is 0.35 to 0.50. A mole fraction higher than 0.5 results in a high electrical resistivity and a mole fraction less than 0.35 produces a light emission having a wavelength longer than visible light. Referring to FIG. 2, reference character 8 designates a light emitting diode which comprises an n-type wafer 1 of $Cd_{1-x}Mg_xTe$ single crystal having a p-type thin layer 2 on one surface. The p-type layer 2 has over the whole free surface thereof an electrode 3, such as a gold electrode. The other surface of the n-type wafer 1 has on a part of the area thereof another electrode 4 such as an indium electrode. Wire leads 5 and 6 are attached to electrodes 3 and 4, respectively, by means of solder 7. Lead wires 5 and 6 are connected to an electric power supply.

In making the n-type wafer 1, solid solutions of CdTe and metallic Mg, Te are synthesized by heating a mixture of Mg, Te and CdTe compound of a given composition in a graphite crucible at a temperature of 1100° to 1200° C. under an inert gas pressure of more than 10 atm. in order to suppress vaporization of CdTe.

An n-type single crystal is prepared in a manner similar to the Bridgeman-Stockbarger method. A vacuum sealed quartz tube containing the solid solution of $Cd_{1-x}Mg_xTe$ and 0.001 to 0.01 atomic percent of Al is moved through an electric furnace having a temperature gradient of about 5° C./cm. in the downward direction of the gradient at a rate of 10 mm./hour. The highest temperature in the furnace is 1100° to 1200° C., depending on the melting point of the solid solution.

An n-type wafer is obtained by cleaving and polishing the thus formed single crystal. The polished wafer is etched by any available and suitable etchant, such as alcohol containing bromine, rinsed in any available and suitable solvent, such as acetone and/or alcohol, vacuum-sealed in a quartz tube with P and Cd, and heated at a temperature of 670° to 850° C., for instance 670° to 790° C., for a time period of 15 minutes to 72 hours, for instance 15 minutes to 10 hours, in order to form a p-type layer by the diffusion of P into the n-type wafer.

The resultant wafer is provided with an electrode on both flat diffused surfaces thereof by any available and suitable method such as electroless gold plating. The resultant wafer is rinsed in water and cut into a plate having a desired thickness and area, such as 0.3 mm. and 1 mm. x 1 mm. respectively. Final thickness is established by placing of the p-type material covered with gold electrode 3 on the flat surface of the cut plate.

The cut wafer is provided, on the n-type flat surface, with an electrode 4 having a construction as shown in FIG. 2 by any available and suitable method, such as indium soldering. Two leads are connected to said electrodes 3 and 4, respectively by any suitable and available method.

The resultant light emitting diode has an emission spectrum shown by curve A in FIG. 1 when $x$ is 0.4.

Visible light emitting diodes prepared from the solid solutions with various values of $x$ produce emissions of different wavelengths. The peak wavelength of the emission bands becomes short with an increase in X and is 6700 and 5750 m$\mu$ for $x$=0.35 and 0.50 respectively.

The following examples are given to illustrate certain preferred details of this invention.

EXAMPLE 1

Starting materials are commercially available Cd, Mg, and Te of nominal purity of 99.9999, 99.995 and 99.9999 percent, respectively. The most abundant impurity in Mg is Si.

A mixture of 2.70 g. of Mg, 14.18 g. of Te, and 40.0 g. of CdTe prepared from Cd and Te in the usual way is placed into a graphite crucible and is heated about 1 hour at about 1200° C. in argon at a pressure of 20 atm. in a furnace having a graphite heater. The resultant ingot is a red-colored polycrystalline solid solution of $Cd_{0.6}Mg_{0.4}Te$. This solid solution has an absorption edge of 0.6 microns.

50 g. of this solid solution is mixed with 0.35 mg. of Al and is vacuum sealed in a quartz tube coated, on the inner surface, with pyrolytic graphite. The tube is placed in a vertical Bridgeman apparatus having a temperature gradient wherein a high temperature of 1190° C. is spaced 150 mm. from a low temperature of 700° C. The tube is moved downward from the high temperature to the low temperature at a rate of 8 mm./hour. The resulting ingot consists of two blocks of single crystal material.

A wafer of 7 mm. x 7 mm. x 0.7 mm. is prepared from one of the blocks of the single crystal. The wafer is polished with $Al_2O_3$ abrasive having an average particle size of 0.3 microns, is etched in alcoholic solution of bromine and rinsed in acetone. The wafer is then put into an evacuated sealed quartz tube with 0.5 g. of Cd and 0.01 g. of P and is heated at 770° C. for 9 hours for forming a p-type layer on the surface of the wafer.

The resultant wafer comprising a p-n junction is treated in an aqueous solution of acetic acid and aurocyanide at a temperature of 100° C. for 30 seconds. Au may be applied to this surface by a vacuum evaporation method to increase the thickness of the deposited Au.

The wafer is cut into a cube of 1.0 mm. square and 0.3 mm. in thickness. An In electrode is applied to the n-type surface. The resultant light emitting diode has an emission spectrum illustrated in FIG. 1 Curve A and a brightness of about 200 ft.-L at a forward current of 10 ma.

EXAMPLE 2

A light emitting diode is prepared as in Example 1 except that here an n-type $Cd_{0.6}Mg_{0.4}Te$ single crystal is grown with 0.63 mg of Al. This diode has an emission spectrum illustrated by curve C of FIG. 1 and a brightness of about 20 ft.-L at a forward current of 10 ma.

EXAMPLE 3

Light emitting diodes are prepared in a manner similar to that of Example 1 except for the conditions of phosphorus diffusion for forming p-type layers on the surface of the n-type $Cd_{1-x}Mg_xTe$ single crystals. The table shows the brightness of the resultant diodes. It will be apparent from the table that the good brightness of the resultant light emitting diodes requires optimum selection of the parameters for the phosphorus diffusion.

TABLE

| Condition of diffusion | | Brightness, ft.-Lambert at 10 ma. |
|---|---|---|
| Temperature (° C.) | Period of time | |
| 850 | 15 minutes | 10 |
| 850 | 72 hours | 7 |
| 800 | 13 hours | 16 |
| 800 | 72 hours | 12 |
| 750 | 16 hours | 17 |
| 750 | 72 hours | 15 |
| 770 | 72 hours | 14 |
| 670 | 72 hours | 15 |
| 790 | 15 minutes | 22 |
| 790 | 10 hours | 20 |
| 770 | 9 hours | 200 |
| 750 | 10 hours | 27 |
| 700 | 9 hours | 25 |
| 670 | 10 hours | 20 |

EXAMPLE 4

A light emitting diode is prepared in a manner similar to that of Example 1 except the mole fraction X of MgTe in $Cd_{1-x}Mg_xTe$ is 0.35. The brightness of the resultant light emitting diode is 3 foot-Lambert and the emission peak wavelength is 6700 A.

EXAMPLE 5

A light emitting diode is prepared in a manner similar to that of Example 1 except the mole fraction X of MgTe in $Cd_{1-x}Mg_xTe$ is 0.50. The brightness of the resultant light emitting diode is 40 foot-Lambert and the emission peak wavelength is 5750 A.

What is claimed is:

1. A method for making a light emitting diode, said method comprising providing a wafer of a single crystal of n-type solid solution of CdTe and MgTe including, as a dopant, 0.001 to 0.01 atomic percent of Al, and diffusing P into said n-type wafer so as to form a thin p-type layer thereon by heating said wafer in a vapor phase of P and Cd at a temperature of 670° C. to 790° C. for a time period of 15 minutes to 10 hours.

2. A method for making light emitting diode, said method comprising providing a wafer of a single crystal of n-type solid solution of CdTe and MgTe including, as a dopant, 0.001 to 0.01 atomic percent of Al, etching said wafer with an etchant, rinsing said wafer with a solvent, and diffusing P into said n-type wafer so as to form a thin-p-type layer thereon by heating said wafer in a sealed evacuated tube containing a mixture of P and Cd at a temperature of 670° C. to 790° C. for a time period of 15 minutes to 10 hours.

References Cited

UNITED STATES PATENTS 3,413,507 11/1968 Itoh et al. ---- 252—62.3 ZT X
3,560,276 2/1971 Panish et al. ------- 148—171

GEORGE T. OZAKI, Primary Examiner

U.S. Cl. X.R.

252—62.3 ZT; 313—108; 148—186